(12) United States Patent
Zhang et al.

(10) Patent No.: US 11,257,810 B2
(45) Date of Patent: Feb. 22, 2022

(54) ELECTROSTATIC DISCHARGE UNIT, ARRAY SUBSTRATE AND DISPLAY PANEL

(71) Applicants: BOE Technology Group Co., Ltd., Beijing (CN); Hefei Xinsheng Optoelectronics Technology Co., Ltd., Anhui (CN)

(72) Inventors: Miao Zhang, Beijing (CN); Jing Sun, Beijing (CN); Wuxia Fu, Beijing (CN); Songmei Sun, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 793 days.

(21) Appl. No.: 16/074,987

(22) PCT Filed: Dec. 6, 2017

(86) PCT No.: PCT/CN2017/114808
§ 371 (c)(1),
(2) Date: Aug. 2, 2018

(87) PCT Pub. No.: WO2018/176896
PCT Pub. Date: Oct. 4, 2018

(65) Prior Publication Data
US 2021/0202464 A1    Jul. 1, 2021

(30) Foreign Application Priority Data
Mar. 30, 2017 (CN) .......................... 201710204003.0

(51) Int. Cl.
*H01L 27/02* (2006.01)
*H01L 27/12* (2006.01)
(Continued)

(52) U.S. Cl.
CPC .......... *H01L 27/027* (2013.01); *H01L 27/124* (2013.01); *H01L 27/1255* (2013.01);
(Continued)

(58) Field of Classification Search
None
See application file for complete search history.

(56) References Cited

U.S. PATENT DOCUMENTS

| | | | |
|---|---|---|---|
| 2014/0071109 A1* | 3/2014 | Tseng | H02H 9/041 345/211 |
| 2016/0071834 A1* | 3/2016 | Zhang | H01L 29/41733 257/72 |

(Continued)

FOREIGN PATENT DOCUMENTS

| | | |
|---|---|---|
| CN | 103871354 A | 6/2014 |
| CN | 105810677 A | 7/2016 |
| CN | 106876416 A | 6/2017 |

OTHER PUBLICATIONS

Mar. 5, 2018—(WO) International Search Report and Written Opinion Appn PCT/CN2017/114808 with English Translation.

*Primary Examiner* — Benjamin P Sandvik
(74) *Attorney, Agent, or Firm* — Banner & Witcoff, Ltd.

(57) ABSTRACT

An electrostatic discharge unit, an array substrate and a display panel are provided. The electrostatic discharge unit includes: an active layer; a first gate electrode and a second gate electrode which are spaced apart from each other and are insulated from the active layer; and a first electrode and a second electrode which are spaced apart from each other and are respectively connected to the active layer. The first gate electrode is electrically connected to the first electrode, and the second gate electrode is electrically connected to the second electrode.

12 Claims, 7 Drawing Sheets

(51) Int. Cl.
  *G02F 1/1362* (2006.01)
  *G02F 1/1368* (2006.01)
  *H01L 27/32* (2006.01)

(52) U.S. Cl.
  CPC ...... *G02F 1/1368* (2013.01); *G02F 1/136204* (2013.01); *H01L 27/0296* (2013.01); *H01L 27/3244* (2013.01)

(56) References Cited

U.S. PATENT DOCUMENTS

| | | | |
|---|---|---|---|
| 2016/0093744 A1* | 3/2016 | Sugawara | H01L 27/1248 257/43 |
| 2017/0031218 A1* | 2/2017 | Li | H01L 27/1218 |
| 2017/0117705 A1* | 4/2017 | Sekine | H01L 27/0266 |
| 2017/0162605 A1* | 6/2017 | Yamamoto | G09G 3/3648 |
| 2017/0293189 A1* | 10/2017 | Ren | H01L 27/124 |
| 2018/0204830 A1 | 7/2018 | Liu et al. | |

* cited by examiner

ELECTROSTATIC DISCHARGE UNIT, ARRAY SUBSTRATE AND DISPLAY PANEL

The application is a U.S. National Phase Entry of International Application No. PCT/CN2017/114808 filed on Dec. 6, 2017, designating the United States of America and claiming priority to Chinese Patent Application No. 201710204003.0, filed on Mar. 30, 2017. The present application claims priority to and the benefit of the above-identified applications and the above-identified applications are incorporated by reference herein in their entirety.

TECHNICAL FIELD

At least one embodiment of the present disclosure relates to an electrostatic discharge unit, an array substrate and a display panel.

BACKGROUND

In a production of a display device, for example, a liquid crystal display, static electricity is generated in processes of drying, etching, rubbing an alignment film, cutting, carrying and the like. In order to prevent static electricity from damaging the display device, for example, an electrostatic discharge unit is arranged on an array substrate of the display device to release the high level generated by an accumulation of static electricity.

SUMMARY

At least one embodiment of the disclosure provides an electrostatic discharge unit. The electrostatic discharge unit comprises: an active layer; a first gate electrode and a second gate electrode which are spaced apart from each other and are insulated from the active layer; and a first electrode and a second electrode which are spaced apart from each other and are respectively connected to the active layer. The first gate electrode is electrically connected to the first electrode, and the second gate electrode is electrically connected to the second electrode.

For example, in a direction perpendicular to the active layer, the first gate electrode and the second gate electrode are respectively at different sides of the active layer.

For example, in a direction perpendicular to the active layer, the first gate electrode and the second gate electrode are at a same side of the active layer.

For example, the first gate electrode and the second gate electrode are in a same layer.

At least one embodiment of the disclosure provides an array substrate. The array substrate comprises an electrostatic discharge unit. The electrostatic discharge unit comprises an active layer; a first gate electrode and a second gate electrode which are spaced apart from each other and are insulated from the active layer; and a first electrode and a second electrode which are spaced apart from each other and are respectively connected to the active layer. The first gate electrode is electrically connected to the first electrode, and the second gate electrode is connected to the second electrode.

For example, the array substrate further comprises: a first signal line electrically connected to the first gate electrode and the first electrode; and a second signal line electrically connected to the second gate electrode and the second electrode.

For example, the first signal line comprises at least one of a gate line, a data line, a common electrode line, a power line, a ground line, a frame start scanning line and a reset line; and the second signal line comprises at least one of the gate line, the data line, the common electrode line, the power line, the ground line, the frame start scanning line and the reset line.

For example, the first signal line is the gate line or the data line, and the second signal line is the common electrode line; or, the first signal line is the common electrode line, and the second signal line is the gate line or the data line.

For example, the array substrate comprises a display region and a periphery region at an outer side of the display region; and in a direction perpendicular to the active layer, the first gate electrode and the second gate electrode are respectively at different sides of the active layer.

For example, in the display region, a plurality of gate lines and a plurality of data lines cross with each other to define a plurality of pixel units, and each of the pixel units comprises a thin film transistor and a pixel electrode connected to the thin film transistor; the first gate electrode, the plurality of gate lines and a gate electrode of the thin film transistor are in a same layer and are made of a same material; the active layer and an active layer of the thin film transistor are in a same layer and are made of a same material; the first electrode, the second electrode, the plurality of data lines, a source electrode of the thin film transistor and a drain electrode of the thin film transistor are in a same layer and are made of a same material; and the second gate electrode and the pixel electrode are in a same layer and are made of a same material.

For example, in the display region, a plurality of gate lines and a plurality of data lines cross with each other to define a plurality of pixel units, and each of the pixel units comprises a thin film transistor and a light-emitting element connected to the thin film transistor, and the light-emitting element comprises an anode, a cathode and a light-emitting layer sandwiched between the anode and the cathode; the first gate electrode, the plurality of gate lines and a gate electrode of the thin film transistor are in a same layer and are made of a same material; the active layer and an active layer of the thin film transistor are in a same layer and are made of a same material; the first electrode, the second electrode, the plurality of data lines, a source electrode of the thin film transistor and a drain electrode of the thin film transistor are in a same layer and are made of a same material; and the second gate electrode and the anode are in a same layer and are made of a same material, or, the second gate electrode and the cathode are in a same layer and are made of a same material.

For example, the array substrate comprises a display region and a periphery region at an outer side of the display region; and in a direction perpendicular to the active layer, the first gate electrode and the second gate electrode are at a same side of the active layer.

For example, the first gate electrode and the second gate electrode are in a same layer.

For example, in the display region, a plurality of gate lines and a plurality of data lines cross with each other to define a plurality of pixel units, and each of the pixel units comprises a thin film transistor and a pixel electrode connected to the thin film transistor; the first gate electrode, the second gate electrode, the plurality of gate lines and a gate electrode of the thin film transistor are in a same layer and are made of a same material; the active layer and an active layer of the thin film transistor are in a same layer and are made of a same material; and the first electrode, the second electrode, the plurality of data lines, a source electrode of the thin film transistor and a drain electrode of the thin film transistor are in a same layer and are made of a same material.

For example, in the display region, a plurality of gate lines and a plurality of data lines cross with each other to define a plurality of pixel units, and each of the pixel units comprises a thin film transistor and a light-emitting element connected to the thin film transistor, and the light-emitting element comprises an anode, a cathode and a light-emitting layer sandwiched between the anode and the cathode; the active layer and an active layer of the thin film transistor are in a same layer and are made of a same material; the first electrode, the second electrode, the plurality of data lines, a source electrode of the thin film transistor and a drain electrode of the thin film transistor are in a same layer and are made of a same material; and the first gate electrode, the second gate electrode and the anode are in a same layer and are made of a same material, or, the first gate electrode, the second gate electrode and the cathode are in a same layer and are made of a same material.

For example, the electrostatic discharge unit is arranged in the periphery region.

At least one embodiment of the disclosure further provides a display panel. The display panel comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2b is a structural schematic diagram of the electrostatic discharge unit illustrated in FIG. 2a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
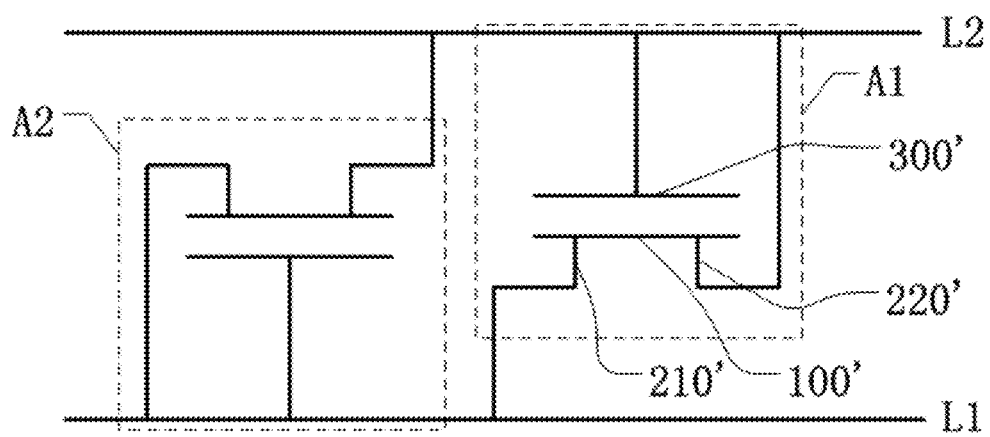
FIG. 1 is a circuit diagram of a bi-directional electrostatic discharge.

Currently, electrostatic discharge units can only achieve a unidirectional discharge, and therefore in an electrostatic discharge application requiring a bi-directional electrostatic discharge, at least two electrostatic discharge units are required. FIG. 1 is a circuit diagram of a bi-directional electrostatic discharge. As illustrated in FIG. 1, two electrostatic discharge units A1 and A2 are arranged between line L1 and line L2, each of the electrostatic discharge unit A1 and the electrostatic discharge unit A2 includes an active layer 100', a first electrode 210', a second electrode 220' and a gate electrode 300', and the second electrode 220' is electrically connected to the gate electrode 300'. For example, the electrostatic discharge unit A1 and the electrostatic discharge unit A2 are configured to release static electricity on the line L1 and the line L2. The electrostatic discharge unit A1 is configured to release the static electricity from the line L2 to the line L1, the line L2 is electrically connected to the gate electrode 300' of the electrostatic discharge unit A1 and the second electrode 220' of the electrostatic discharge unit A1, and the line L1 is electrically connected to the first electrode 210' of the electrostatic discharge unit A1; the electrostatic discharge unit A2 is configured to release the static electricity from the line L1 to the line L2, the line L1 is electrically connected to the gate electrode 300' of the electrostatic discharge unit A2 and the second electrode 220' of the electrostatic discharge unit A2, and the line L2 is electrically connected to the first electrode 210' of the electrostatic discharge unit A2. Taking the electrostatic discharge unit A1 as an example, in a case where a voltage of a high level is generated on the line L2 due to an accumulation of the static electricity, the gate electrode 330' turns on the active layer 100', thus the first electrode 210' and the second electrode 220' are electrically connected with each other and the static electricity on the line L2 is released to the line L1, so that the line L2 is protected from being damaged by the static electricity. But, in a case where a voltage of a high level is generated on the line L1 due to the accumulation of the static electricity, the static electricity cannot be released from the electrostatic discharge unit A1 to the line L2, therefore it is necessary to arrange the electrostatic discharge unit A2 in order that the static electricity on the line L1 is released to the line L2 by the electrostatic discharge unit A2. The principle of releasing the static electricity by the electrostatic discharge unit A2 is the same as that of releasing the static electricity by the electrostatic discharge unit A1. In FIG. 1, it is necessary to arrange two electrostatic discharge units A1 and A2 to achieve the bi-directional electrostatic discharge, which takes up extra wiring space of a product, for example, a display panel, and which is unbeneficial to the miniaturization of the product.

At least one embodiment of the present disclosure provides an electrostatic discharge unit, an array substrate and a display panel. The electrostatic discharge unit includes: an active layer, a first gate electrode, a second gate electrode, a first electrode and a second electrode; the first gate electrode and the second gate electrode are spaced apart from each other and are insulated from the active layer, the first electrode and the second electrode are spaced apart from each other and are respectively connected to the active layer, the first gate electrode is electrically connected to one of the first electrode and the second electrode, and the second gate electrode is electrically connected to the other of the first electrode and the second electrode. The above-mentioned electrostatic discharge unit reduces a space occupied by the electrostatic discharge unit while at least achieving the bi-directional electrostatic discharge. For example, in the following embodiments of the present disclosure, the technical solution is described taking a case, where the first gate electrode is electrically connected to the first electrode and the second gate electrode is electrically connected to the second electrode, as an example.

In the following embodiments of the present disclosure, connection between the components for example is an electrical connection. For example, taking a connection between the first gate electrode and the first electrode as an example, the connection between the first gate electrode and the first electrode is the electrical connection.

In the following, the electrostatic discharge unit, the array substrate and the display panel provided by the embodiments of the present disclosure are described in details by referring to the figures.

Figure 2A:
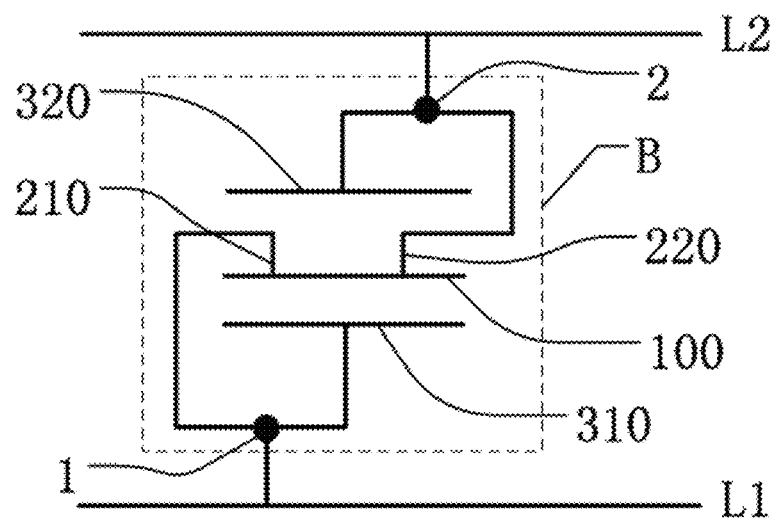
FIG. 2a is a circuit diagram of an electrostatic discharge unit provided by at least one embodiment of the present disclosure.
Figure 2B:
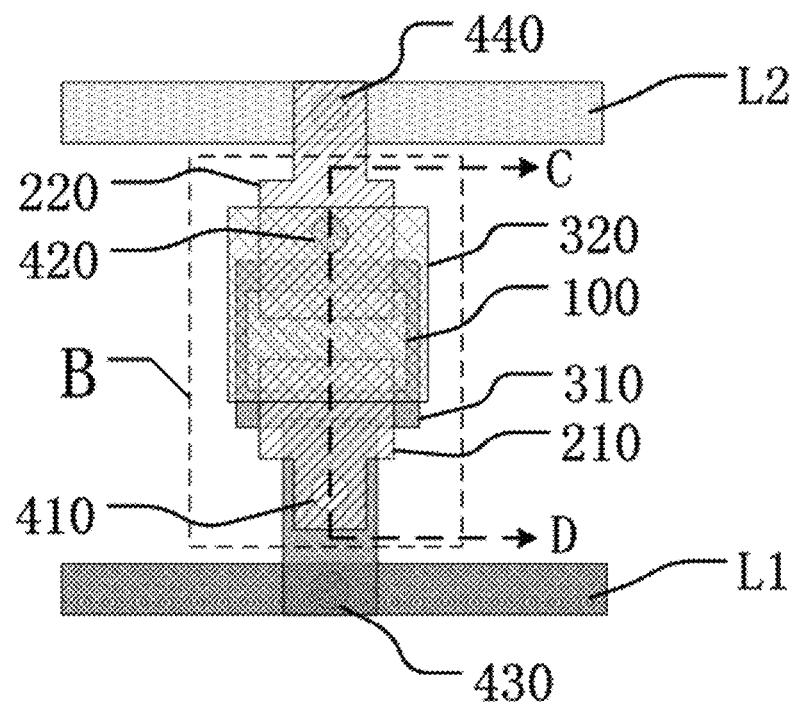

At least one embodiment of the present disclosure provides the electrostatic discharge unit. FIG. 2a is a circuit diagram of the electrostatic discharge unit provided by at least one embodiment of the present disclosure, and FIG. 2b is a structural schematic diagram of the electrostatic discharge unit illustrated in FIG. 2a. For example, as illustrated in FIG. 2a and FIG. 2b, the electrostatic discharge unit B includes: an active layer 100, a first gate electrode 310, a second gate electrode 320, a first electrode 210 and a second electrode 220; the first gate electrode 310 and the second gate electrode 320 are spaced apart from each other and are insulated from the active layer 100, the first electrode 210 and the second electrode 220 are spaced apart from each other and are respectively connected to the active layer 100, the first electrode 210 is electrically connected to the first gate electrode 310, and the second electrode 220 is electrically connected to the second gate electrode 320. In a case where a voltage of a high level is on the first gate electrode 310, the first gate electrode 310 turns on the active layer 100 of the electrostatic discharge unit B; in a case where the voltage of the high level is on the second gate electrode 320, the second gate electrode 320 turns on the active layer 100 of the electrostatic discharge unit B; and thus the bi-directional electrostatic discharge is achieved.

As illustrated in FIG. 2a, for example, the electrostatic discharge unit B is electrically connected between the first signal line L1 and the second signal line L2. For example, the electrostatic discharge unit B is provided between the first signal line L1 and the second signal line L2 and electrically connected to the first signal line L1 and the second signal line L2. For example, in a case where a voltage on the first signal line L1 is the high level due to an accumulation of static electricity, the first gate electrode 310 turns on the active layer 100, thus the first electrode 210 and the second electrode 220 are electrically connected with each other, and the static electricity on the first signal line L1 is released to the second signal line L2; for example, in a case where a voltage on the second signal line L2 is the high level due to the accumulation of static electricity, the second gate electrode 320 turns on the active layer 100, thus the first electrode 210 and the second electrode 220 are electrically connected with each other, and the static electricity on the second signal line L2 is released to the first signal line L1. In this way, the bi-directional electrostatic discharge between the line L1 and the line L2 is achieved.

As illustrated in FIG. 2b, in the electrostatic discharge unit B, the active layer 100, the first electrode 210 and the second electrode 220, the first gate electrode 310, and the second gate electrode 320 for example are in different layers, for example, connections between components in different layers are achieved by arranging through holes. For example, the first electrode 210 is connected to the first gate electrode 310 via a first through hole 410, and the second electrode 220 is connected to the second gate electrode 320 via a second through hole 420. Taking a case, where the electrostatic discharge unit B is configured for achieving an electrostatic protection for the first signal line L1 and the second signal line L2, as an example, the first signal line L1 is connected to the first electrode 210 and the first gate electrode 310 via a third hole 430, and the second signal line L2 is connected to the second electrode 220 and the second gate electrode 320 via a fourth hole 440, thus the bi-directional electrostatic discharge is achieved between the first signal line L1 and the second signal line L2.

It should be noted that, the electrical connection between the first electrode 210 and the first gate electrode 310, the electrical connection between the second electrode 220 and the second gate electrode 320, the electrical connection between the first signal line L1 and the first electrode 210, the electrical connection between the line L1 and the first gate electrode 310, the electrical connection between the line L2 and the second electrode 220, and the electrical connection between the line L2 and the second gate electrode 320 are not limited to the connection manners illustrated in FIG. 2a and FIG. 2b, the above connections may be achieved by other manners, for example, by an external circuit, etc. FIG. 2d is another circuit diagram of the electrostatic discharge unit provided by at least one embodiment of the present disclosure. For example, as illustrated in FIG. 2d, the first gate electrode 310 and the first electrode 210 are respectively connected to the line L1, and the second gate electrode 320 and the second electrode 220 are respectively connected to the line L2, thus the electrostatic discharge unit B also achieves the electrical connection between the first gate electrode 310 and the first electrode 210 and the electrical connection between the second gate electrode 320 and the second electrode 220 by external circuits such as the line L1 and the line L2.

In at least one embodiment of the present disclosure, as long as the electrical connection between the first electrode 210 and the first gate electrode 310 and the electrical connection between the second electrode 220 and the second gate electrode 320 are achieved, and the electrical connection between the line L1 and the first electrode 210, the electrical connection between the line L1 and the first gate electrode 310, the electrical connection between the line L2 and the second electrode 220 and the connection between the line L2 and the second gate electrode 320 are achieved, limitations are not imposed to the manners of achieving the electrical connections as described above.

In at least one embodiment of the present disclosure, limitations are not imposed to application fields of the electrostatic discharge unit. For example, the electrostatic discharge unit provided by at least one embodiment of the present disclosure is applied to a display panel, for example, the electrostatic discharge unit is applied to achieve an electrostatic protection for signal lines on an array substrate of the display panel. In this way, a part of structures of the electrostatic discharge unit may be simultaneously formed during structures, such as thin film transistors, of the array substrate are prepared, and thus the complexity of the preparation process of the array substrate is not increased even though the electrostatic discharge unit is provided.

Figure 2C:
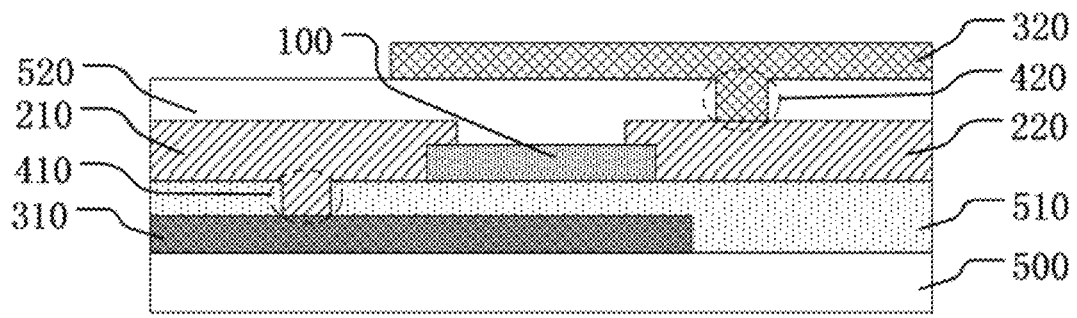
FIG. 2c is a sectional view along C-D direction of the electrostatic discharge unit illustrated in FIG. 2b.
Figure 2D:
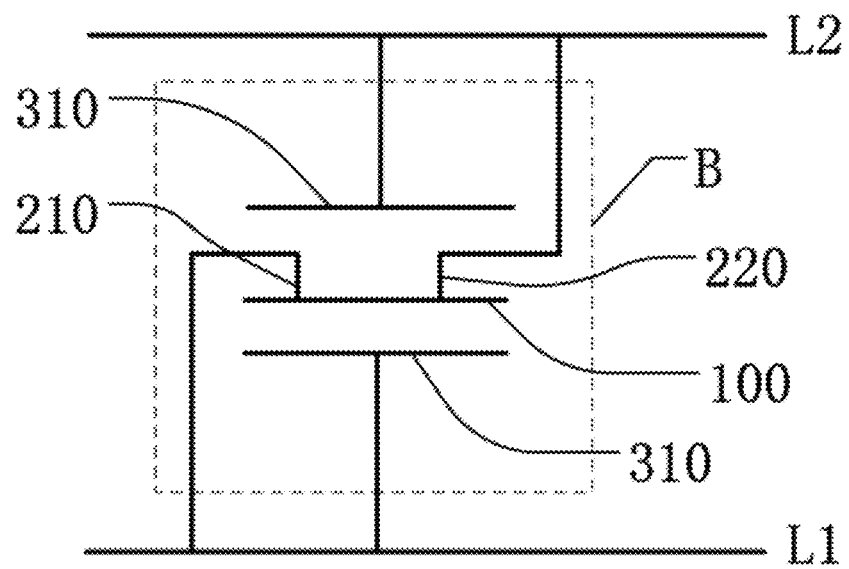
FIG. 2d is another circuit diagram of the electrostatic discharge unit provided by at least one embodiment of the present disclosure.

FIG. 2c is a sectional view along C-D direction of the electrostatic discharge unit illustrated in FIG. 2b. In at least one embodiment of the present disclosure, as illustrated in FIG. 2c, the electrostatic discharge unit includes the first gate electrode 310, the active layer 100, the first electrode 210 and the second electrode 220, and the second gate electrode 320, which are sequentially arranged on a base substrate 500. The first gate electrode 310 is spaced apart from the active layer 100 by a gate insulation layer 510, and the second gate electrode 320 is spaced apart from the active layer 100 by an insulation layer 520, the first electrode 210 and the second electrode 220 are spaced apart from each other and are respectively connected to the active layer 100, the first electrode 210 is electrically connected to the first gate electrode 310 by the first through hole 410 arranged in the gate insulation layer 510, and the second electrode 220 is electrically connected to the second gate electrode 320 by the second through hole 420 arranged in the insulation layer 520. For example, the first electrode 210 and the second electrode 220 are arranged in a same layer.

For example, in the electrostatic discharge unit provided by at least one embodiment of the present disclosure, the first electrode 210 is one of a source electrode and a drain electrode, and the second electrode 220 is the other of the source electrode and the drain electrode.

For example, in the electrostatic discharge unit provided by at least one embodiment of the present disclosure, in a direction perpendicular to the active layer 100, for example, as illustrated in FIG. 2a, FIG. 2b and FIG. 2c, the first gate electrode 310 and the second gate electrode 320 are at different sides of the active layer 100 respectively.

For example, in the electrostatic discharge unit provided by at least one embodiment of the present disclosure, in the direction perpendicular to the active layer 100, the first gate electrode 310 and the second gate electrode 320 are at a same side of the active layer 100, which will be described by several examples in the following.

Figure 3:
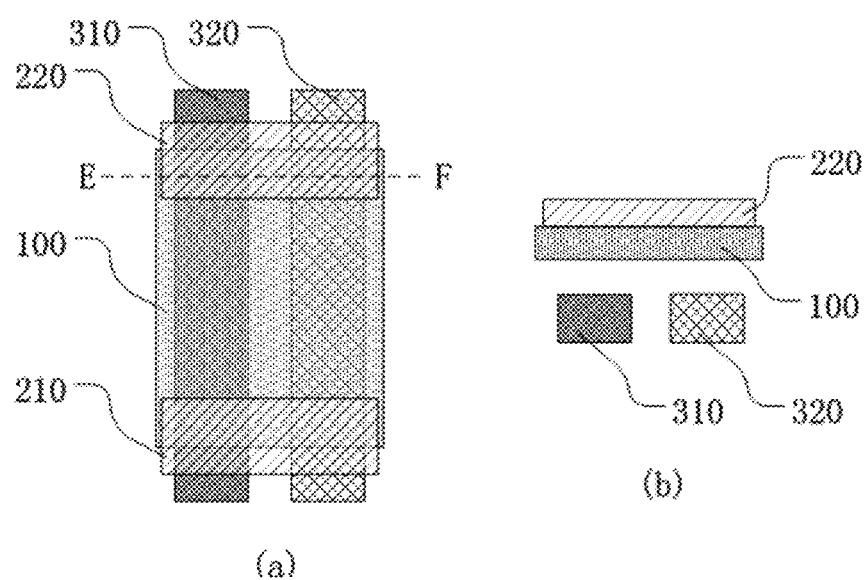
FIG. 3 is a structural schematic diagram of the electrostatic discharge unit provided by at least one embodiment of the present disclosure.

FIG. 3 is a structural schematic diagram of the electrostatic discharge unit provided by at least one embodiment of the present disclosure. More specifically, FIG. 3 is a schematic diagram of a part of the electrostatic discharge unit, in which FIG. 3(a) is a top view of the part of the electrostatic discharge unit, and FIG. 3(b) is a sectional view along E-E direction of the electrostatic discharge unit illustrated in FIG. 3(a). For example, as illustrated in FIG. 3, in at least one embodiment of the present disclosure, the electrostatic discharge unit is provided with only one active layer 100, the first electrode 210 and the second electrode 220 are spaced apart from each other and are respectively connected to the active layer 100, and the first gate electrode 310 and the second gate electrode 320 are at a same side of the active layer 100 and are spaced apart from each other, and each of the first gate electrode 310 and the second gate electrode 320 is configured to turn on the active layer 100 between the first electrode 210 and the second electrode 220. In this way, taking a case, where the voltage on the first gate electrode 310 and the first electrode 210 is the high level, as an example, the first gate electrode 310 turns on the active layer 100 so that the first electrode 210 is electrically connected to the second electrode 220, thus the voltage of the high level on the first gate electrode 310 and the first electrode 210 is released to the second gate electrode 320 and the second electrode 220.

Figure 4:
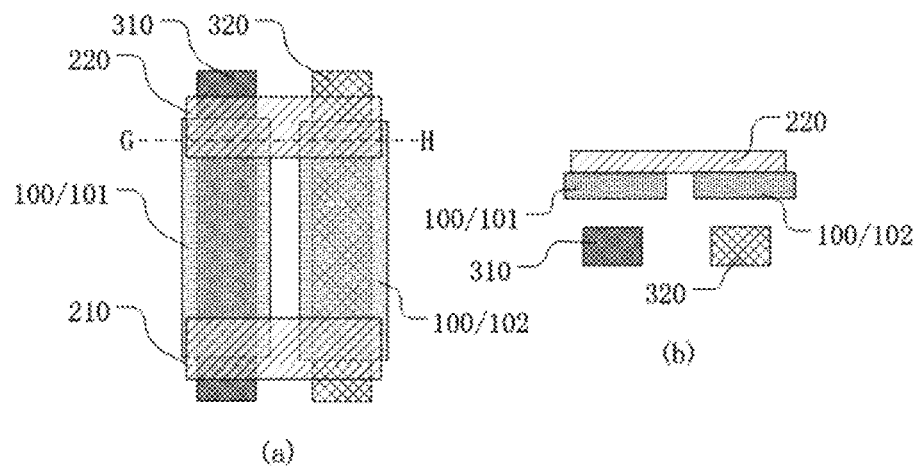
FIG. 4 is another structural schematic diagram of the electrostatic discharge unit provided by at least one embodiment of the present disclosure.

FIG. 4 is another structural schematic diagram of the electrostatic discharge unit provided by at least one embodiment of the present disclosure. More specifically, FIG. 4 is a schematic diagram of a part of the electrostatic discharge unit, in which FIG. 4(a) is a top view of the part of the electrostatic discharge unit, and FIG. 4(b) is a sectional view along G-H direction of the electrostatic discharge unit illustrated in FIG. 4(a). For example, as illustrated in FIG. 4, in at least one embodiment of the present disclosure, the active layer 100 of the electrostatic discharge unit includes a first active layer 101 and a second active layer 102 which are spaced apart from each other, the first electrode 210 and the second electrode 220 are spaced apart from each other and are respectively connected to each of the first active layer 101 and the second active layer 102, the first gate electrode 310 and the second gate electrode 320 are at a same side of the active layer 100 and are spaced apart from each other, the first gate electrode 310 overlaps the first active layer 101 and the first gate electrode 310 is configured to turn on the first active layer 101 between the first electrode 210 and the second electrode 220, and the second gate electrode 320 overlaps the second active layer 102 and the second gate electrode 320 is configured to turn on the second active layer 102 between the first electrode 210 and the second electrode 220. In a case where the voltage on the first gate electrode 310 and the first electrode 210 is the high level, the first gate electrode 310 turns on the first active layer 101 so that the first electrode 210 is electrically connected to the second electrode 220, thus the first gate electrode 310 and the first electrode 210 release the static electricity to the second gate electrode 320 and the second electrode 220. In a case where the voltage on the second gate electrode 320 and the second electrode 220 is the high level, the second gate electrode 320 turns on the second active layer 102 so that the first electrode 210 is electrically connected to the second electrode 220, thus the second gate electrode 320 and the second electrode 220 release the static electricity to the first gate electrode 310 and the first electrode 210.

It should be noted that, in a case where the first gate electrode 310 and the second gate electrode 320 are at the same side of the active layer 100, the first gate electrode 310 and the second gate electrode 320 are at a side, facing away from the first electrode 210 and the second electrode 220, of the active layer 100, or are at a side, facing the first electrode 210 and the second electrode 220, of the active layer 100; and the first gate electrode 310 and the second gate electrode 320 are in a same layer or are in different layers. In at least one embodiment of the present disclosure, as long as the first gate electrode 310 and the second gate electrode 320 are configured to turn on the active layer 100 respectively, limitations are not imposed to the specific position the first gate electrode 310 and the second gate electrode 320.

It should be noted that, in at least one embodiment of the present disclosure, the electrostatic discharge unit is not limited to the ones in the above embodiments (such as the embodiments illustrated in FIG. 2a~2d, FIG. 3 and FIG. 4) which only achieve the bi-directional electrostatic discharge, and the electrostatic discharge unit provided by at least one embodiment of the present disclosure may further achieve a multidirectional (three or more directions) electrostatic discharge.

For example, referring to the embodiments illustrated in FIG. 3 or FIG. 4, a plurality of gate electrodes which are spaced from each other (for example, the first gate electrode 310, the second gate electrode 320 and a third gate electrode, a fourth gate electrode 320, etc., which are spaced from each other) are provided at at least one side of the active layer 100, each of the plurality of gate electrodes is electrically connected to one of the first electrode 210 and the second electrode 220, and the plurality of gate electrodes are respectively connected to different signal lines. In this way, for example, a voltage on any one of the plurality of gate electrodes is the high level, the gate electrode with the high level turns on the active layer 100 of the electrostatic discharge unit so that the static electricity on the signal line connected to the gate electrode with the high level is released. In this way, the electrostatic discharge unit achieves the multidirectional electrostatic discharge.

In the following, the technical solution in the following embodiments is described by taking a case, where the first gate electrode 310 and the second gate electrode 320 are at different sides of the active layer 100 as illustrated in FIG. 2c, as an example.

At least one embodiment of the present disclosure further provides an array substrate, and the array substrate includes the electrostatic discharge unit as described above. The electrostatic discharge unit includes: the active layer; the first gate electrode and the second gate electrode which are spaced apart from each other and are insulated from the active layer; and the first electrode and the second electrode which are spaced apart from each other and are respectively connected to the active layer. The first gate electrode is electrically connected to one of the first electrode and the second electrode, and the second gate electrode is connected to the other of the first electrode and the second electrode. In the array substrate of at least one embodiment of the present disclosure, the structure of the electrostatic discharge unit may be referred to the electrostatic discharge unit described above, which are not repeated herein.

For example, the array substrate according to at least one embodiment of the present disclosure includes a display region and a periphery region at an outer side of the display region. The electrostatic discharge unit is arranged in the display region and/or in the periphery region. The opening rate of the array substrate is being taken into account, for example, the electrostatic discharge unit is arranged in the periphery region.

Figure 5:
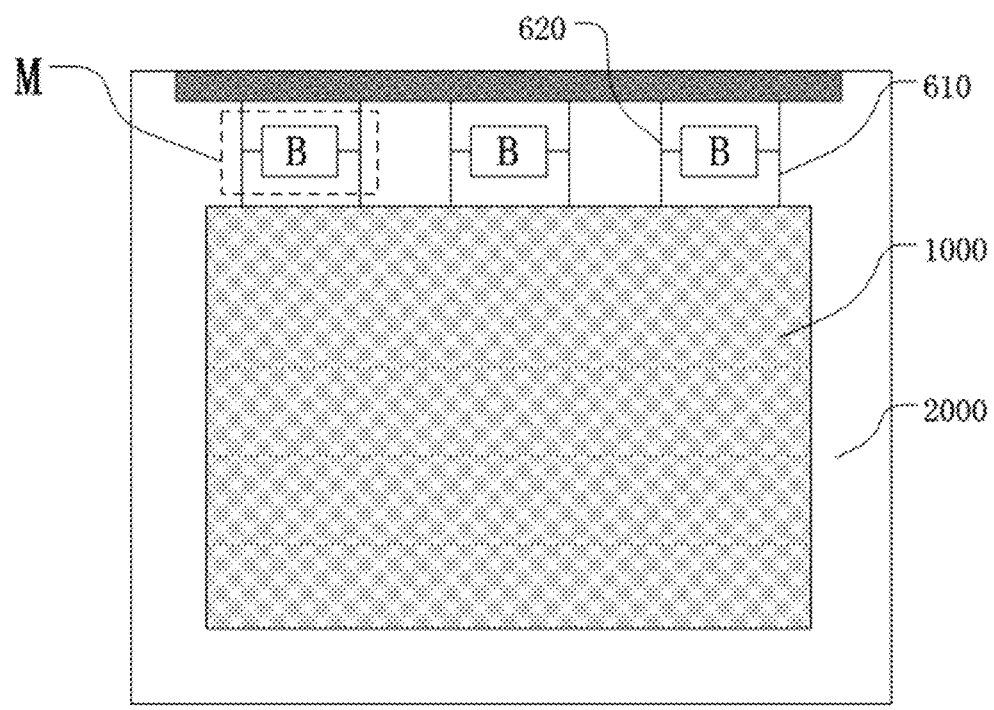
FIG. 5 is a plane view of an array substrate provided by at least one embodiment of the present disclosure.

FIG. 5 is a plane view of the array substrate provided by at least one embodiment of the present disclosure. For example, as illustrated in FIG. 5, the array substrate provided by at least one embodiment of the present disclosure includes a display region 1000 and a periphery region 2000 at an outer side of the display region 1000, and the periphery region 2000 is provided with the electrostatic discharge unit B to achieve an electrostatic protection for the array substrate. For example, the array substrate is provided with a first signal line 610 and a second signal line 620, and the electrostatic discharge unit B is electrically connected between the first signal line 610 and the second signal line 620. For example, the first signal line 610 is connected to the first gate electrode 310 of the electrostatic discharge unit B and one of the first electrode 210 and the second electrode 220 of the electrostatic discharge unit B, and the second signal line 620 is connected to the second gate electrode 320 of the electrostatic discharge unit B and the other of the first electrode 210 and the second electrode 220 of the electrostatic discharge unit B. In a case where a voltage on one of the first signal line 610 and the second signal line 620 is the high level due to an accumulation of the static electricity, the static electricity is released to the other of the first signal line 610 and the second signal line 620 by the electrostatic discharge unit B, and the specific static electricity releasing process of the electrostatic discharge may be referred to the relative description above, which are not repeated herein.

In at least one embodiment of the present disclosure, limitations are not imposed to the type of the first signal line and the second signal line provided in the array substrate. The array substrate for example is provided with a variety of signal lines. For example, in at least one embodiment of the present disclosure, the signal lines of the array substrate include: a gate line, a data line, a common electrode line, a power line, a ground line, a frame start scanning line and a reset line, etc. For example, as illustrated in FIG. 5, the first signal line 610 is at least one of the gate line, the data line, the common electrode line, the power line, the ground line, the frame start scanning line and the reset line; and the second signal line 620 is at least one of the gate line, the data line, the common electrode line, the power line, the ground line, the frame start scanning line and the reset line.

For example, in at least one embodiment of the present disclosure, the first signal line 610 and the second signal line 620 are different types of signal lines; for example, the first signal line 610 is the gate line or the data line, and the second signal line 620 is the common electrode line; or, the first signal line 610 is the common electrode line, and the second signal line 620 is the gate line or the data line.

For example, in at least one embodiment of the present disclosure, the first signal line 610 and the second signal line 620 are a same type of signal line, for example, both the first signal line 610 and the second signal line 620 are the common electrode line.

In the embodiments of the present disclosure, limitations are not imposed to the types of the signal lines (for example, the first signal line 610 and second signal line 620) of the array substrate, as long as the signal lines generate static electricity or possess static electricity which is to be released. In the following, the technical solutions in the following embodiments are described by taking a case, where the first signal line 610 is the data line and the second signal line 620 is the common electrode line, as an example.

For example, in the array substrate provided by at least one embodiment of the present disclosure, a plurality of the gate lines and a plurality of the data lines cross with each other in the display region to define a plurality of pixel units, and each of the pixel units includes a thin film transistor. For example, in at least one embodiment of the present disclosure, the structures in the electrostatic discharge unit and other components of the array substrate are in a same layer and are made of a same material, and in this way, the electrostatic discharge unit is formed simultaneously in a process of forming other components of the array substrate, and the complexity of the preparation process of the array substrate is not increased.

Figure 6:
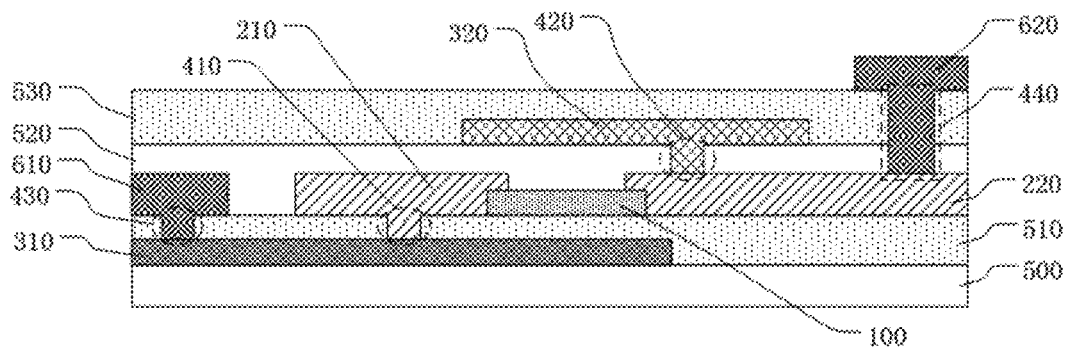
FIG. 6 is a sectional view of a region M in the array substrate illustrated in FIG. 5.

An example (example one) of the embodiments of the present disclosure provides the array substrate, FIG. 6 is a sectional view of a region M in the array substrate illustrated in FIG. 5, and the first gate electrode 310 and the second gate electrode 320 are provided at different sides of the active layer 100 respectively.

For example, as illustrated in FIG. 6, the region M in the array substrate includes the first gate electrode 310, the active layer 100, the first electrode 210 and the second electrode 220, and the second gate electrode 320, which are sequentially arranged on the base substrate 500. The first gate electrode 310 is spaced apart from the active layer 100 by the gate insulation layer 510, the second gate electrode 320 is spaced apart from the active layer 100 by the insulation layer 520, the first electrode 210 and the second electrode 220 are spaced apart from each other and are respectively connected to the active layer 100, the first electrode 210 is electrically connected to the first gate electrode 310 by the first through hole 410 arranged in the gate insulation layer 510, and the second electrode 220 is electrically connected to the second gate electrode 320 by the second through hole 420 arranged in the insulation layer 520. The array substrate further includes the first signal line 610 and the second signal line 620, the first signal line 610 is connected to the first electrode 210 and the first gate electrode 310 for example via the third hole 430, and the second signal line 620 is connected to the second electrode 220 and the second gate electrode 320 for example via the fourth hole 440.

In the example one, for example, the first gate electrode 310, the gate lines and a gate electrode of the thin film transistor are in a same layer and are made of a same material.

A material of the first gate electrode 310 for example is a copper-based metal, such as copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb), etc. The material of the first gate electrode 310 for example a chromic-based metal, such as chromium molybdenum alloy (Cr/Mo), chromium titanium alloy (Cr/Ti), chromium molybdenum titanium alloy (Cr/Mo/Ti) etc. The material of the first gate electrode 310 for example is aluminum or aluminum alloy, etc.

In the example one, for example, the active layer 100 and an active layer of the thin film transistor are in a same layer and are made of a same material.

A material of the active layer 100 for example includes amorphous silicon, polysilicon, or a metal oxide such as indium gallium zinc (IGZO), indium zinc oxide (IZO), zinc oxide (ZnO), gallium zinc oxide (GZO), etc.

In the example one, for example, the first electrode 210, the second electrode 220, the data lines, a source electrode of the thin film transistor and a drain electrode of the thin film transistor are in a same layer and are made of a same material.

A material of the first electrode 210 and the second electrode 220 for example include a metal material such as molybdenum, titanium, copper and chromium, etc. A material of the first electrode 210 and the second electrode 220 for example is an alloy material formed by the above metals, for example, a copper-based metal material including at least one of copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb), etc., or a chromic-based metal, such as chromium molybdenum alloy (Cr/Mo), chromium titanium alloy (Cr/Ti), chromium molybdenum titanium alloy (Cr/Mo/Ti) etc.

In the example one, for example, each of the pixel units further includes a pixel electrode connected to the thin film transistor. The second gate electrode 320 and the pixel electrode for example are in a same layer and are made of a same material.

The second gate electrode 320 and the pixel electrode for example are made of a transparent conductive material. For example, a material for forming the second gate 320 and the pixel electrode includes at least one of indium tin oxide (ITO), indium zinc oxide (IZO), indium gallium oxide (IGO), gallium zinc oxide (GZO), zinc oxide (ZnO), indium oxide ($In_2O_3$), alumina zinc (AZO) and carbon nanotubes, etc.

In the example one, for example, each of the pixel units further includes a light-emitting element connected to the thin film transistor, and the light-emitting element includes an anode, a cathode and a light-emitting layer sandwiched between the anode and the cathode. For example, the second gate electrode 320 and the anode are in a same layer and are made of a same material, or, the second gate electrode and the cathode are in a same layer and are made of a same material.

A material of the anode includes any one of metallic aluminum and an conductive oxide (for example, ITO, IGZO), etc., and a material of the cathode includes any one of metallic potassium, metallic lithium, metallic calcium, metallic magnesium, metallic indium, magnesium aluminum alloy, magnesium silver alloy and lithium aluminum alloy.

It should be noted that, in the example one, the arrangement of the second gate 320 is not limited the above-mentioned arrangement, as long as the second gate 320 is provided at a side, facing away from the base substrate 500, of the active layer 100, and is connected to the second electrode 220, and limitations are not imposed to the arrangement of the second gate 320 in the embodiments of the present disclosure.

Another example (example two) of the embodiments of the present disclosure provides the array substrate, and in the array substrate, the first gate electrode 310 and the second gate electrode 320 are provided at a same side of the active layer 100. The first gate electrode 310 and the second gate electrode 320 are in a same layer or in different layers, the relative description may be referred to the above-mentioned embodiments, which are not repeated herein. In the example two, in order to simply the preparation process of the array substrate, the technical solution is described taking a case, where the first gate electrode 310 and the second gate electrode 320 are in the same layer, as an example.

In the array substrate provided by the example two, each of the pixel units for example further includes the pixel electrode connected to the thin film transistor. For example, the first gate electrode 310, the second gate electrode 320, the gate lines and the gate electrode of the thin film transistor are in a same layer and are made of a same material; or the first gate electrode 310, the second gate electrode 320 and the pixel electrode are in a same layer and are made of a same material. For example, the active layer 100 of the electrostatic discharge unit and the active layer of the thin film transistor are in a same layer and are made of a same material; the first electrode 210, the second electrode 220, the data lines, the source electrode of the thin film transistor and the drain electrode of the thin film transistor are in a same layer and be made of a same material.

In the array substrate provided by the example two, each of the pixel units for example further includes the light-emitting element connected to the thin film transistor, and the light-emitting element includes the anode, the cathode and the light-emitting layer sandwiched between the anode and the cathode. For example, the active layer 100 of the electrostatic discharge unit and the active layer of the thin film transistor are in a same layer and are made of a same material; the first electrode 210, the second electrode 220, the data lines, the source electrode of the thin film transistor and the drain electrode of the thin film transistor are in a same layer and are made of a same material. For example, the first gate electrode 310, the second gate electrode 320, and the anode are in a same layer and are made of a same material; or, the first gate electrode 310, the second gate electrode 320, and the cathode are in a same layer and are made of a same material; or, the first gate electrode 310, the second gate electrode 320, the gate lines and the gate electrode of the thin film transistor are in a same layer and are made of a same material.

It should be noted that the array substrate in the example two is not limited to the above-mentioned descriptions, the specific structures of the array substrate may be referred to the relative descriptions in the example one, which are not repeated herein.

In the array substrate provided by at least one embodiment of the present disclosure, the electrostatic discharge unit achieves at least the bi-directional electrostatic discharge, and the electrostatic discharge unit takes up a small space in the array substrate, which is beneficial to the miniaturization of the product. If the space permits, two or more electrostatic discharge units are provided between the first signal line and the second signal line, so that in a case where one of the electrostatic discharge units is damaged, the other or the others still play a role of electrostatic protection, which improves the reliability of the electrostatic protection.

At least one embodiment of the present disclosure provides a display panel, and the display panel includes any one of the above-mentioned array substrates.

In an example, the display panel is a liquid crystal display panel including the array substrate and an opposite substrate, the array substrate and the opposite substrate are opposite to each other to form a liquid crystal cell, and the liquid crystal cell is filled with a liquid crystal material. For example, the opposite substrate is a color filter substrate. The pixel electrode of each of the pixel units of the array substrate is configured to form an electric field to control the degree of rotation of the liquid crystal material, thus a display operation is achieved.

In another example, the display panel is an organic light-emitting diode (OLED) display panel, a lamination of organic light-emitting materials is formed on the array substrate, and the anode or the cathode of each of the pixel units is configured to drive the organic light-emitting materials to emit light to carry out the display operation.

In further another example, the display panel is an electronic paper display panel, an electronic ink layer is formed on the array substrate, and the pixel electrode of each of the pixel units is configured to drive charged micro-particles in the electronic ink layer to move to carry out the display operation.

At least one embodiment of the present disclosure further provides a preparation method of the electrostatic discharge unit, and the method includes: forming an active layer; forming a first gate electrode and a second gate electrode which are spaced apart from each other and are insulated from the active layer; and forming a first electrode and a second electrode which are spaced apart from each other and are respectively connected to the active layer. The first gate electrode is electrically connected to one of the first electrode and the second electrode, and the second gate electrode is electrically connected to the other one of the first electrode and the second electrode. In the embodiments of the present disclosure, the specific structures of the electrostatic discharge unit may be referred to the relative descriptions above, which are not repeated herein.

In order to make it easy to understand the preparation method of the electrostatic discharge unit in the embodiments of the present disclosure, a process of the preparation method is described in at least one example of the embodiments of the present disclosure. FIG. 7a~FIG. 7g are diagrams of the process of the preparation method of the electrostatic discharge unit provided by at least one embodiment of the present disclosure. Taking the structure of the electrostatic discharge unit illustrated in FIG. 2c as an example, for example, as illustrated in FIG. 7a~FIG. 7g, the preparation method of the electrostatic discharge unit illustrated in FIG. 2c includes the following process.

Figure 7A:
FIG. 7a~FIG. 7g are diagrams of a process of a preparation method of an electrostatic discharge unit provided by at least one embodiment of the present disclosure.

As illustrated in FIG. 7a, providing a base substrate 500, a gate metal film is deposited on the substrate 500 and performing a patterning process on the gate metal film to form a first gate electrode 310.

In at least one embodiment of the present disclosure, limitations are not imposed to the specific process of the patterning process. For example, the patterning process includes: a photoresist layer is coated on a structure layer that is to be patterned, exposing the photoresist layer using a mask plate, developing the photoresist layer which has been exposed to form a photoresist pattern, and etching the structure layer using the photoresist pattern as a mask, and then the photoresist pattern is removed optionally.

In at least one embodiment of the present disclosure, limitations are not imposed to the preparation material of the first gate electrode. For example, a material of the first gate electrode 310 is a copper-based metal, such as copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb), etc.; or, the material of the first gate electrode 310 is a chromic-based metal, such as chromium molybdenum alloy (Cr/Mo), chromium titanium alloy (Cr/Ti), chromium molybdenum titanium alloy (Cr/Mo/Ti) etc.; or the material of the first gate electrode 310 is aluminum or aluminum alloy, etc.

Figure 7B:
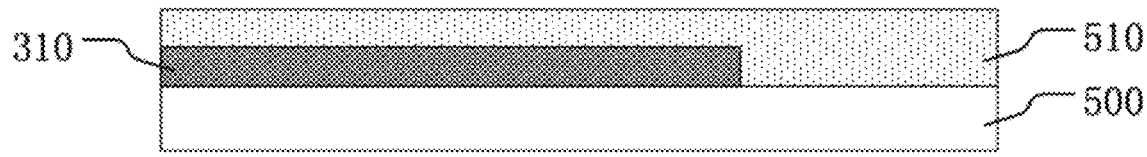

As illustrated in FIG. 7b, a gate insulation layer 510 is deposited on the base substrate 500 which is provided with the first gate electrode 310.

In at least one embodiment of the present disclosure, limitations are not imposed to a preparation material of the gate insulation layer of the electrostatic discharge unit. For example, the preparation material of the gate insulation layer 510 includes at least one of silicon nitride (SiNx), silicon oxide (SiOx), aluminum oxide ($Al_2O_3$), aluminum nitride (AlN) or other suitable materials.

Figure 7C:
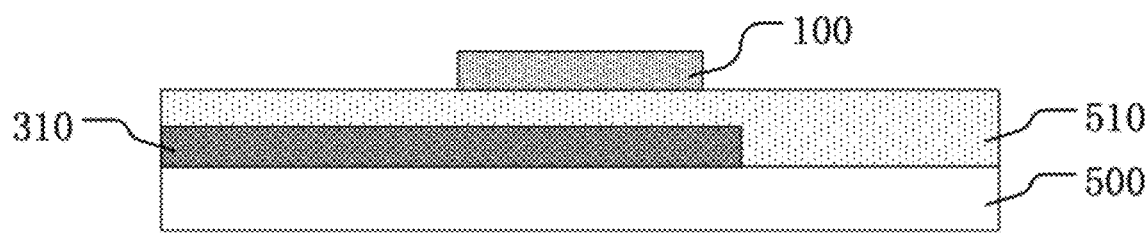

As illustrated in FIG. 7c, a semiconductor film is deposited on the gate insulation layer 510 and a patterning process is performed on the semiconductor film to form an active layer 100.

In at least one embodiment of the present disclosure, limitations are not imposed to a preparation material of the active layer of the electrostatic discharge unit. For example, the preparation material of the active layer 100 includes at least one of amorphous silicon, polysilicon, and metal oxides such as indium gallium zinc (IGZO), indium zinc oxide (IZO), zinc oxide (ZnO), gallium zinc oxide (GZO), etc.

Figure 7D:
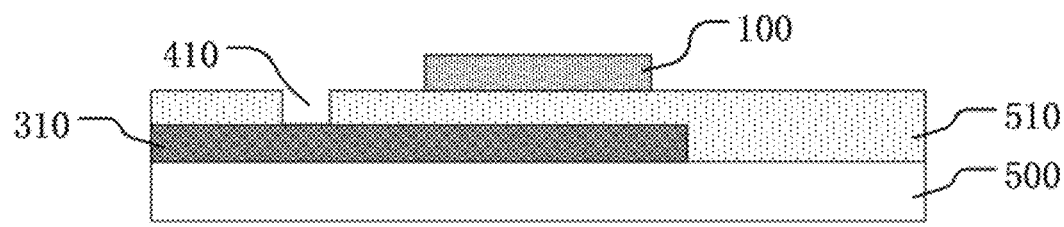

As illustrated in FIG. 7d, a patterning process is performed on the gate insulation layer 510 to form a first through hole 410, and the first through hole 410 exposes the first gate electrode 310.

Figure 7E:
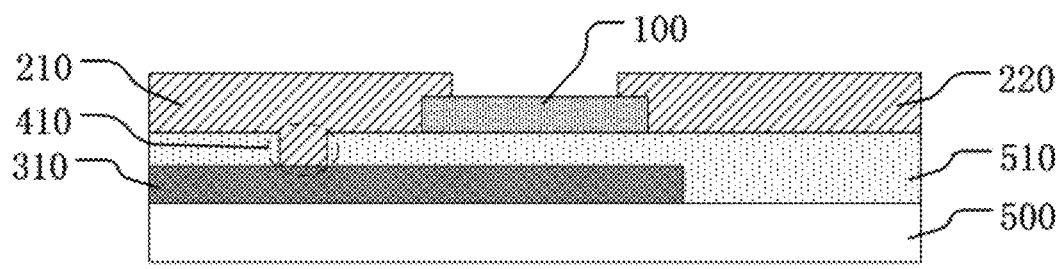

As illustrated in FIG. 7e, a metal layer is deposited on the base substrate 500 which is provided with the active layer 100, and a patterning process is performed on the metal layer to form a first electrode 210 and a second electrode 220. The first electrode 210 and the second electrode 220 are spaced apart from each other and are respectively connected to the active layer 100, and the first electrode 210 is electrically connected to the first gate electrode 310 by the first through hole 410.

In at least one embodiment of the present disclosure, limitations are not imposed to a preparation material of the first electrode and a preparation material of the second electrode. For example, both the preparation material of the first electrode and the preparation material the second electrode include a metal material such as molybdenum, titanium, copper and chromium; or, both the preparation material of the first electrode and the preparation material the second electrode include an alloy material formed by the above metals, for example, a copper-based metal material including at least one of copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb), etc., or a chromic-based metal, such as chromium molybdenum alloy (Cr/Mo), chromium titanium alloy (Cr/Ti), chromium molybdenum titanium alloy (Cr/Mo/Ti) etc.

Figure 7F:
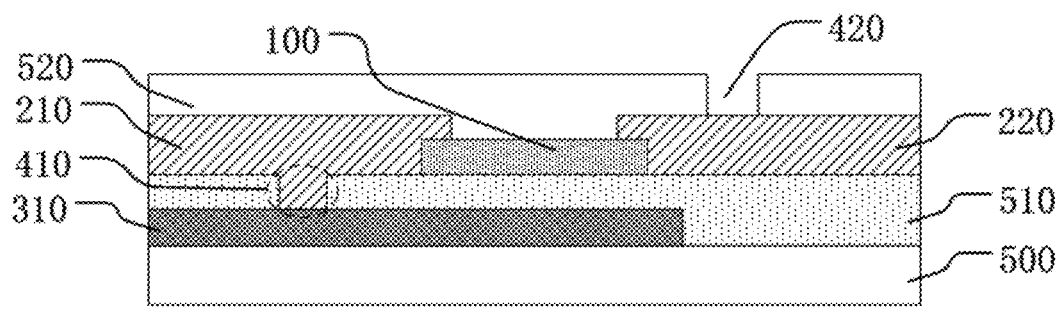

As illustrated in FIG. 7f, an insulation film is deposited on the base substrate 500 and a patterning process is performed on the insulation film to form an insulation layer 520 and a second through hole 420, and the second through hole 420 is in the insulation layer 520 and expose the second electrode 220. For example, a material used for preparing the insulation layer 520 includes at least one of silicon nitride (SiNx), silicon oxide (SiOx), etc.

Figure 7G:
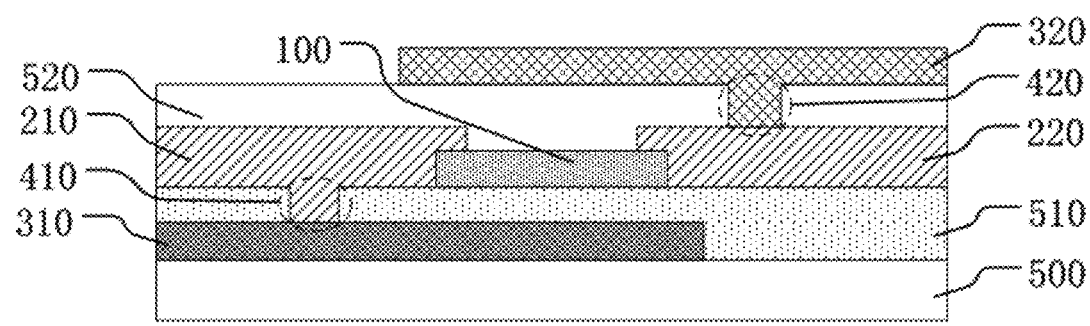

As illustrated in FIG. 7g, a conductive film is deposited on the insulation layer 520 and a patterning process is performed on the conductive film to form a second gate electrode 320, and the second gate electrode 320 is connected to the second electrode 220 via the second through hole 420.

For example, a preparation material of the second gate electrode 320 includes at least one of indium tin oxide (ITO), indium zinc oxide (IZO), indium gallium oxide (IGO), gallium zinc oxide (GZO), zinc oxide (ZnO), indium oxide ($In_2O_3$), alumina zinc (AZO) and carbon nanotubes, etc.

It should be noted that the preparation method of the electrostatic discharge unit is not limited to the above-mentioned descriptions, the specific preparation method is determined according to the specific structure of the electrostatic discharge unit, and the specific structure of the electrostatic discharge unit may be referred to the relative descriptions above, which are not repeated herein.

At least one embodiment of the present disclosure provides the electrostatic discharge unit, the array substrate and the display panel, and the embodiments of the present disclosure possess at least one of the following advantages:

(1) at least one embodiment of the present disclosure provides the electrostatic discharge unit, and the electrostatic discharge unit achieve at least the bi-directional electrostatic discharge, and the electrostatic discharge unit takes up a small space in the array substrate, which is beneficial to the miniaturization of the product;

(2) at least one embodiment of the present disclosure provides the array substrate, the electrostatic discharge unit is simultaneously formed during structures, such as thin film transistors, in the display region of the array substrate are prepared, which cannot increase the preparation process of the array substrate and can save production cost even though the electrostatic discharge unit is provided.

For the present disclosure, the following should be noted:

(1) only the structures involved in the embodiments of the present disclosure are illustrated in the drawings of the embodiments of the present disclosure, and other structures may refer to usual designs;

(2) the thickness and shape of each film in the drawings do not reflect the real scale, and the purpose is just to illustrate the content of the embodiments of the present disclosure schematically;

(3) the embodiments and features in different embodiments of the present disclosure may be combined in case of no conflict.

What are described above is related to the illustrative embodiments of the disclosure only and not limitative to the scope of the disclosure; the scopes of the disclosure are defined by the accompanying claims.

What is claimed is:

1. An array substrate, comprising an electrostatic discharge unit, wherein
the electrostatic discharge unit comprises an active layer; a first gate electrode and a second gate electrode which are spaced apart from each other and are insulated from the active layer; and a first electrode and a second electrode which are spaced apart from each other and are respectively connected to the active layer; and
the first gate electrode is electrically connected to the first electrode, and the second gate electrode is connected to the second electrode;
the array substrate comprises a display region and a periphery region at an outer side of the display region; and in a direction perpendicular to the active layer, the first gate electrode and the second gate electrode are respectively at different sides of the active layer;
in the display region, a plurality of gate lines and a plurality of data lines cross with each other to define a plurality of pixel units, and each of the pixel units comprises a thin film transistor and a light-emitting element connected to the thin film transistor, and the light-emitting element comprises an anode, a cathode, and a light-emitting layer sandwiched between the anode and the cathode;
the first gate electrode, the plurality of gate lines, and a gate electrode of the thin film transistor are in a same layer and are made of a same material;
the active layer and an active layer of the thin film transistor are in a same layer and are made of a same material;
the first electrode, the second electrode, the plurality of data lines, a source electrode of the thin film transistor, and a drain electrode of the thin film transistor are in a same layer and are made of a same material; and
the second gate electrode and the anode are in a same layer and are made of a same material, or, the second gate electrode and the cathode are in a same layer and are made of a same material.

2. The array substrate according to claim 1, further comprising:
a first signal line electrically connected to the first gate electrode and the first electrode; and a second signal line electrically connected to the second gate electrode and the second electrode.

3. The array substrate according to claim 2, wherein the first signal line comprises at least one of a gate line, a data line, a common electrode line, a power line, a ground line, a frame start scanning line, and a reset line; and the second signal line comprises at least one of the gate line, the data line, the common electrode line, the power line, the ground line, the frame start scanning line, and the reset line.

4. The array substrate according to claim 3, wherein the first signal line is the gate line or the data line, and the second signal line is the common electrode line; or, the first signal line is the common electrode line, and the second signal line is the gate line or the data line.

5. The array substrate according to claim 1, wherein the electrostatic discharge unit is arranged in the periphery region.

6. A display panel, comprising the array substrate according to claim 1.

7. An array substrate, comprising an electrostatic discharge unit, wherein the electrostatic discharge unit comprises an active layer; a first gate electrode and a second gate electrode which are spaced apart from each other and are insulated from the active layer; and a first electrode and a second electrode which are spaced apart from each other and are respectively connected to the active layer; and the first gate electrode is electrically connected to the first electrode, and the second gate electrode is connected to the second electrode;

the array substrate comprises a display region and a periphery region at an outer side of the display region; and in a direction perpendicular to the active layer, the first gate electrode and the second gate electrode are at a same side of the active layer;

the first gate electrode and the second gate electrode are in a same layer;

in the display region, a plurality of gate lines and a plurality of data lines cross with each other to define a plurality of pixel units, and each of the pixel units comprises a thin film transistor and a light-emitting element connected to the thin film transistor, and the light-emitting element comprises an anode, a cathode, and a light-emitting layer sandwiched between the anode and the cathode;

the active layer and an active layer of the thin film transistor are in a same layer and are made of a same material;

the first electrode, the second electrode, the plurality of data lines, a source electrode of the thin film transistor, and a drain electrode of the thin film transistor are in a same layer and are made of a same material; and the first gate electrode, the second gate electrode, and the anode are in a same layer and are made of a same material, or, the first gate electrode, the second gate electrode, and the cathode are in a same layer and are made of a same material.

8. The array substrate according to claim 7, further comprising:

a first signal line electrically connected to the first gate electrode and the first electrode; and a second signal line electrically connected to the second gate electrode and the second electrode.

9. The array substrate according to claim 8, wherein the first signal line comprises at least one of a gate line, a data line, a common electrode line, a power line, a ground line, a frame start scanning line, and a reset line; and the second signal line comprises at least one of the gate line, the data line, the common electrode line, the power line, the ground line, the frame start scanning line, and the reset line.

10. The array substrate according to claim 9, wherein the first signal line is the gate line or the data line, and the second signal line is the common electrode line; or, the first signal line is the common electrode line, and the second signal line is the gate line or the data line.

11. The array substrate according to claim 7, wherein the electrostatic discharge unit is arranged in the periphery region.

12. A display panel, comprising the array substrate according to claim 7.

* * * * *